(12) United States Patent
Kojima

(10) Patent No.: US 7,762,820 B2
(45) Date of Patent: Jul. 27, 2010

(54) SOLDER BALL SOCKET CONNECTOR

(75) Inventor: Yutaka Kojima, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/306,037

(22) PCT Filed: Jun. 27, 2007

(86) PCT No.: PCT/US2007/014939

§ 371 (c)(1),
(2), (4) Date: Oct. 7, 2009

(87) PCT Pub. No.: WO2008/002619

PCT Pub. Date: Jan. 3, 2008

(65) Prior Publication Data

US 2010/0015823 A1    Jan. 21, 2010

(30) Foreign Application Priority Data

Jun. 27, 2006    (JP) .............................. 2006-176233

(51) Int. Cl.
*H01R 12/00*    (2006.01)

(52) U.S. Cl. ......................................... 439/71; 439/81

(58) Field of Classification Search ................... 439/66, 439/71, 81, 82, 91, 571, 591
See application file for complete search history.

(56) References Cited

U.S. PATENT DOCUMENTS

| | | | |
|---|---|---|---|
| 6,881,087 B2 * | 4/2005 | Norris et al. | ................ 439/342 |
| 6,981,881 B2 | 1/2006 | Adachi et al. | |
| 7,241,147 B2 * | 7/2007 | Lloyd et al. | ................... 439/66 |

FOREIGN PATENT DOCUMENTS

| | | |
|---|---|---|
| JP | 53-21484 | 2/1978 |
| JP | 06-333624 | 12/1994 |
| JP | 2005-158536 | 6/2005 |
| WO | WO 03/030604 A1 | 4/2003 |

OTHER PUBLICATIONS

International Search Report for PCT/US2007/014939.

* cited by examiner

*Primary Examiner*—Khiem Nguyen
(74) *Attorney, Agent, or Firm*—Timothy M. Morella

(57) ABSTRACT

A socket connector (10) utilizes contacts (41) that have a shape similar to an inverted ohm sign and which have two flexible contact arms (43) located at one end thereof for contacting elements such as solder balls (62). The other end of the contact have a closed end and the contacts may be slotted in increase their flexibility or they may be solid.

8 Claims, 9 Drawing Sheets

SOLDER BALL SOCKET CONNECTOR

BACKGROUND OF THE INVENTION

The present invention relates generally to socket connectors, and more particularly to solder ball connectors of reduced dimension.

Conventionally, when a semiconductor device such as an IC or an LSI (Large Scale Integrated Circuit) is connected to a circuit board such as a printed circuit board, terminals of the semiconductor device are electrically connected to conductive traces of the circuit board via a socket attached to the circuit board. Also, when inspecting electric characteristics of a packaged semiconductor device in an assembly process, terminals of the packaged semiconductor device are connected to a circuit board for inspection in which a circuit for inspection is formed, via a socket for inspecting the semiconductor device (for example, refer to Japanese Patent Application Laid-Open (Kokai) No. 2005-158536).

FIG. 9 is a cross-sectional view of a conventional socket. Such a socket uses a base board 301 for connecting the terminals of a semiconductor device to traces 306 of the circuit board 304. A sliding board 302 which slides laterally and a cover member 303 which is movable vertically are provided above the base board 301. The base board 301 is formed from an insulating material and includes a number of dent portions 307 to accommodate contacts 305.

The contacts 305 are formed from a conductive metal plate and have a unique shape. The body portion of each contact 305 is accommodated in a dent portion 307, and two leg portions of the contact 305 project upward from the dent 307. The two leg portions are arranged to extend across a partition 308. The lower end portion of the contact body portion contacts each of the circuit board traces 306, and the two leg portions contact a terminal (not shown) of the semiconductor device, for example, a solder ball. Therefore, each terminal of the semiconductor device contacts a trace of the circuit board 304. In this case, since the tips of the two leg portions hold the terminal from both sides thereof as if they are sandwiching the terminal, and thus a connection between the two leg portions and the terminal is obtained.

However, in such a conventional socket, the tips of the leg portions sandwich the terminal of the semiconductor device by using the elastic force of the contact 305, i.e., spring force of the contact 305, and therefore, if the spring force of the contact 305 is weak, it becomes difficult to maintain electric connection state between the contact 305 and the terminal. In recent years, as semiconductor devices have been increasingly smaller, a pitch between terminals has also been smaller, and accordingly, a pitch between contacts 305 of the socket should also be smaller. Therefore, the size of the contacts 305 need to be reduced, and the contacts 305 must become thinner. The spring force of the contact 305 becomes weaker, and often the leg portions of the contact 305 cannot hold and sandwich the terminal with sufficient force. As the density of terminals of the semiconductor device increases, the number of terminals also increases. Therefore, it becomes important to absorb distortion between a surface where a number of contacts 305 is aligned, and the circuit board 304 or the cover member 303.

SUMMARY OF THE INVENTION

A general object of the present invention is to solve the above problems of the conventional socket, and to provide a socket that absorbs distortion of the device connected to it, by applying a biasing force to connection terminals using support members which can support the connection terminals while allowing the connection terminals to move in the vertical direction, that has a simpler construction so that costs can be reduced, that connection between the connection terminal and the device to be connected is ensured, and that has high reliability.

To achieve the above object, the present invention includes a flat first and second support members arranged parallel to each other, and connection terminals supported by at least one of the first support member and the second support member, the connection terminal having a body portion including a bent portion and forming an expanded space therein, a pair of leg portions extending from the body portion generally parallel to each other, and a pair of petal-shaped portions extending from free ends of the leg portions so as to be flared toward their ends, the first support member having first openings in which side portions of the body portion are inserted, and beam-shaped portions separating neighboring first openings and inserted in the expanded space portion, the second support member having second openings through which the pair of leg portions and/or the pair of petal-shaped portions are inserted, and tongue-shaped portions forming opposed sides of the second opening, and the tongue-shaped portions applying a biasing force directed toward each other onto the pair of leg portions and/or the pair of petal-shaped portions when a distance between the pair of leg portions and a space between the pair of petal-shaped portion is increased.

In another aspect of the present invention, the second support member is made of a resin film, and the second openings are formed by removing portions of the resin film in an approximate M shape.

In yet another aspect of the present invention, the second support film is made of a resin film, and the tongue-shaped portions at one ends thereof being connected to the resin film, and facing at free ends thereof outer surfaces of the pair of leg portions and/or the pair of petal-shaped portions.

In yet another aspect of the present invention, the first support member is made of a metallic plate, and the first openings are made by removing portions of the metallic plate so as to pass through the metallic plate.

In yet another aspect of the present invention, the connection terminals are movably supported, the pair of leg portions and/or the pair of petal-shaped portions come into contact with terminals of a first device to be connected, and the bent portions come into contact with terminals of a second device to be connected, so that the terminals and the terminals are brought into electric conduction with each other.

In yet another aspect of the present invention, the terminals of the first device to be connected are solder balls, the solder balls being pushed into between the pair of leg portions and/or between the pair of petal-shaped portions to increase the distance between the pair of leg portions and/or the pair of petal-shaped portions.

In yet another aspect of the present invention, the connection terminal includes a slit continuously extending from one of the petal-shaped portions to the other of petal-shaped portions.

In yet another aspect of the present invention, the connection terminal includes a projection formed on an outer surface of the bent portion.

According to the present invention, the second support member supports the leg portions or the petal-shaped portions, so a biasing force is applied to the connection terminals. By allowing the connection terminals to be supported movably in the vertical direction, distortion of the device to be connected can be absorbed. In other words, according to the construction of the present invention, distortion of the device to be connected is absorbed by supporting the connection terminals with at least one of the first support member and the second support member, and applying biasing force to the connection terminals by providing the tongue-shaped portions in the second support member.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which.

DETAILED DESCRIPTION OF THE PREFERRED EMBODIMENT

Figure 1:
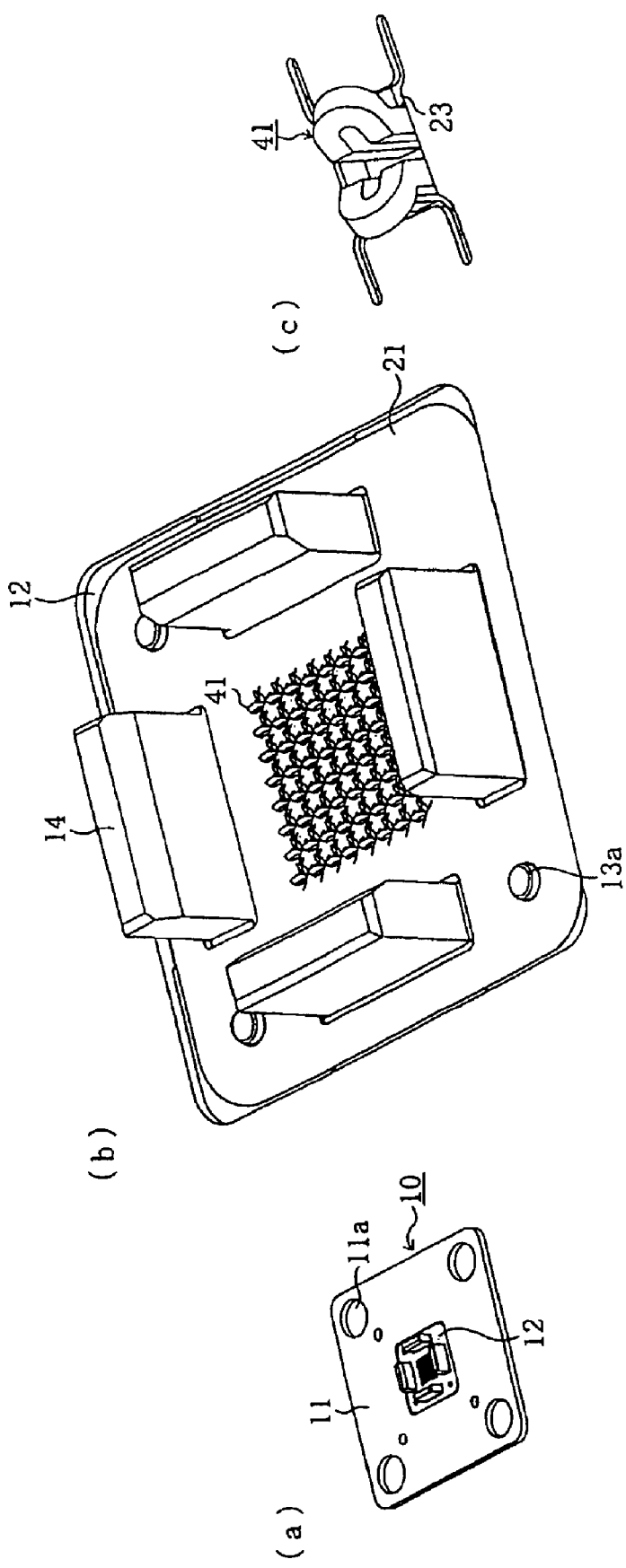
FIGS. 1A to 1C are perspective, exploded views of a socket constructed in accordance with the principles of the present invention.
Figure 2:
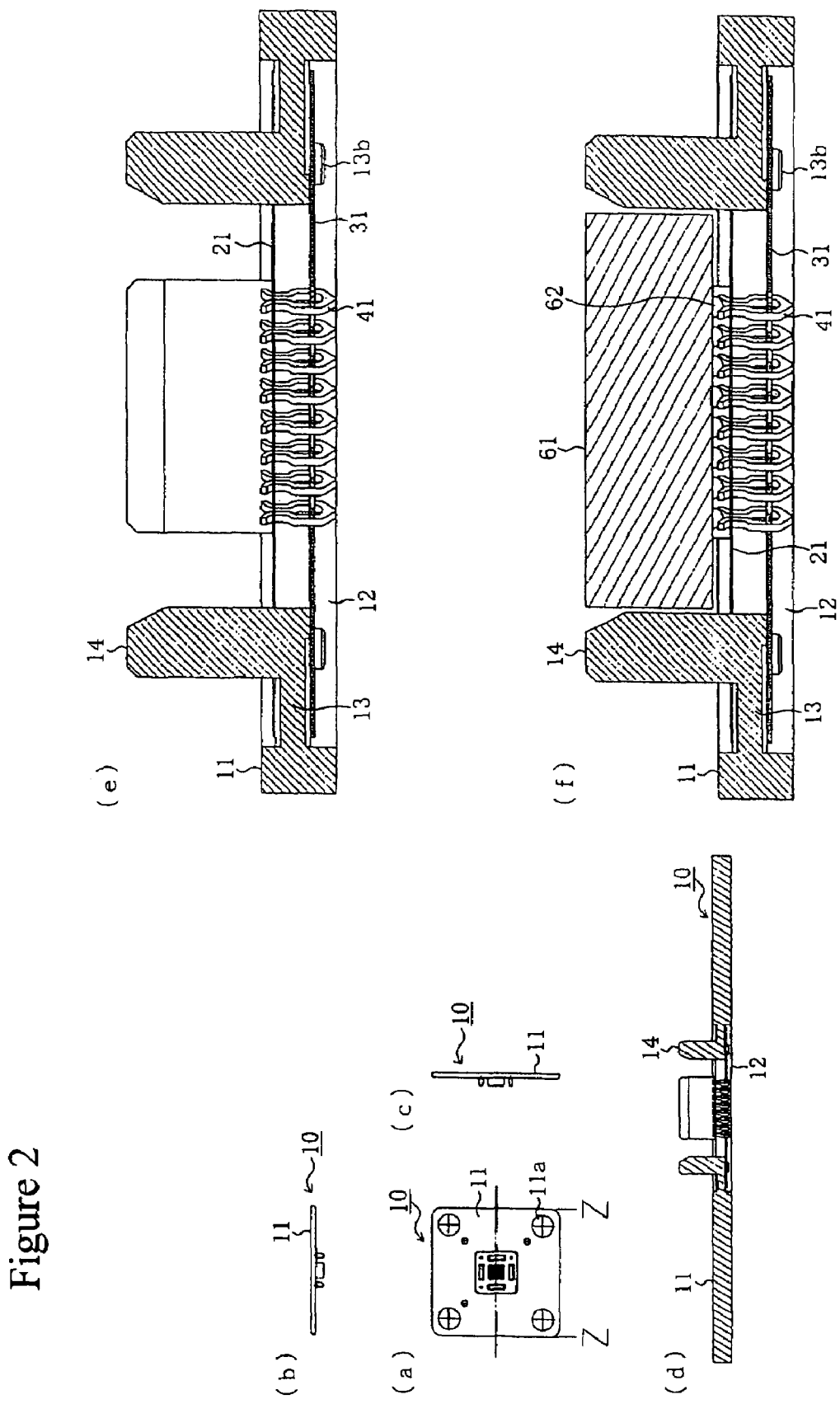
FIGS. 2A to 2F are mostly sectional views showing the socket of FIGS. 1A-1C.
Figure 3:
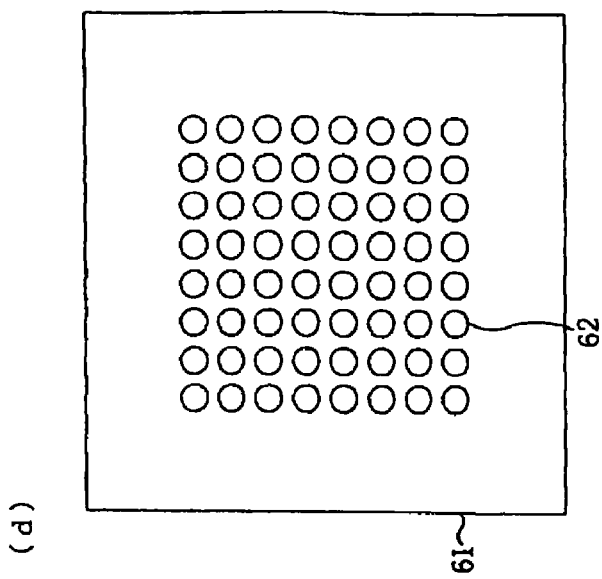
FIGS. 3A to 3D are top and bottom plan and elevational views showing a semiconductor device.
Figure 3:
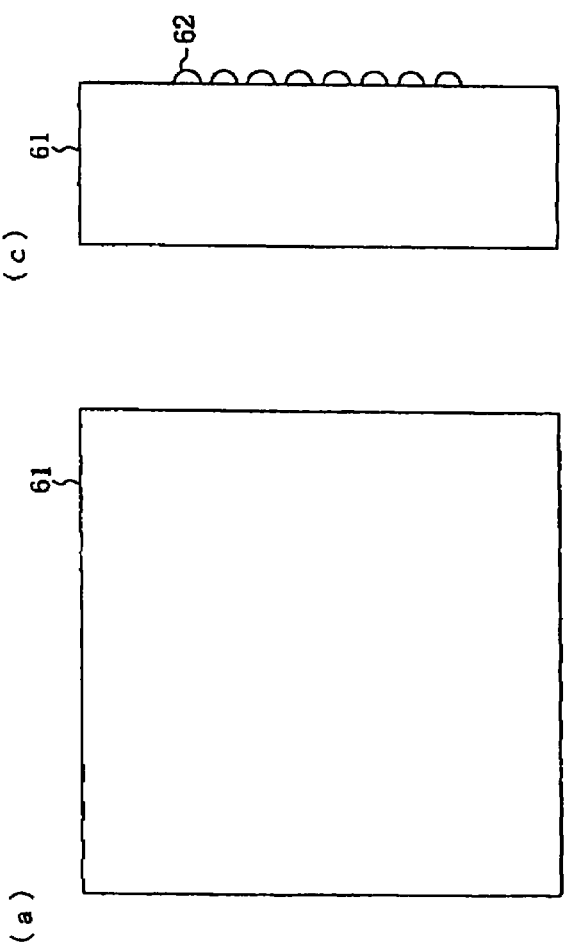
Figure 3:
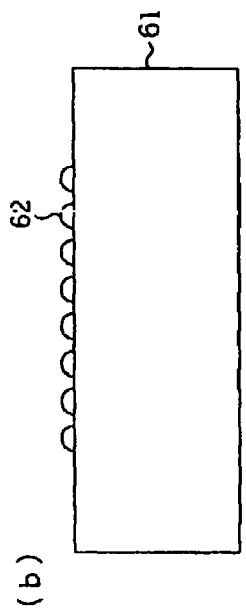

FIGS. 1A to 1C are views showing a socket according to an embodiment of the present invention, in which FIG. 1A is a perspective view of the entire socket. FIG. 1B is an enlarged view of FIG. 1A showing the main part of the socket, and FIG. 1C is an enlarged view of FIG. 1B, showing the connector terminals and their related parts. FIG. 2A is a top plan view of the entire socket, FIG. 2B is a rear view of the entire socket, FIG. 2C is a side view of the entire socket, FIG. 2D is a cross-sectional view of the entire socket taken along the line Z-Z in FIGS. 2A, FIG. 2E is an enlarged view of FIG. 2D, showing a main part of the socket, and FIG. 2F is an enlarged view of FIG. 2D, showing the main part of the socket to which a semiconductor device is fitted. FIGS. 3A to 3D are views showing a semiconductor device according to the embodiment of the present invention, in which FIG. 3A is a top plan view showing the semiconductor device. FIG. 3B is a rear view of the semiconductor device. FIG. 3C is a side view of the semiconductor device, and FIG. 3D is a bottom plan view of the semiconductor device.

In the drawings, reference numeral 10 represents a socket of the present invention, the socket 10 including a housing 11 formed as a substrate with an approximately square or rectangular shape. The housing 11 includes attachment holes 11a through which attachment members (not shown) such as bolts or the like extend, and is attached so that one surface (top surface in FIG. 2D) thereof faces a surface of a first device to be connected on which terminals are arranged, and the other surface (bottom surface in FIG. 2D) thereof faces a surface of a second device to be connected on which terminals are arranged, whereby the housing 11 is used for electrically connecting the terminals of the first device to be connected and corresponding terminals of the second device to be connected to each other.

Here, the first and second devices to be connected may be any kind of electric devices or electronic devices as long as each of them has terminals at least on one side thereof, and, for example, they may be semiconductor devices such ICs and LSIs, electric devices such as personal computers, televisions, game consoles, cameras, and navigation devices, wiring circuit boards such as mother boards and daughter boards of electronic devices, or substrates such as interposers in semiconductor packages or the like. In this embodiment, the explanation will be made, assuming that the first device to be connected is a semiconductor device 61, and the second device to be connected is a semiconductor inspection device. Also, terminals of the semiconductor device 61 and terminals of the semiconductor inspection device may be any type of terminals, such as solder balls, plate-like trace pads, thin and plate-like leads, or needle-shaped electrode pins. In this embodiment, the explanation will be made, assuming that the terminals of the semiconductor device 61 are solder balls 62, as shown in FIGS. 3A to 3D, and the terminals of the semiconductor inspection device are trace pads. Note that the housing 11 may be attached to the semiconductor inspection device directly or via an attachment device such as an attachment frame. Further, the attachment holes 11a may be omitted as necessary.

The housing 11 is integrally formed by an insulating material such as synthetic resin, and the housing 11 has a generally square or rectangular central opening 12 formed through the housing 11 in the thickness direction, in other words, it penetrates the housing 11 from the top surface to the bottom surface, as shown in FIGS. 1A to 2F. Support projecting portions 13 are formed in the central opening 12, which inwardly project from the four side walls of the central opening 12, and further, device guide portions 14, as formed as thick-walled members at the free ends of the support projected portions 13 and protrude upward as shown in FIG. 2E.

Also, a terminal support film 21 as a second support member, and a terminal support frame 31 as a first support member are arranged in the central opening 12. The terminal support film 21 may be made from any type of material so long as it is has an insulating property, such as a resin film, and taking into consideration the fact that the temperature of general environments where semiconductor inspection devices are used is relatively high (for example, approximately 125 degrees centigrade), it is preferred that the terminal support film 21 is made of a film of a so-called engineering plastic such as polyimide, polycarbonate, polyether-ketone, and polyamide, which are heat-resistant. The explanation to follow will include the assumption that the terminal support film 21 is made from a polyimide film. The thickness of the terminal support film 21 may be arbitrarily set, however, a thickness of about 0.025 mm is preferred. The terminal support film 21 is fixed to the top surfaces of the support projecting portions 13 by using fixing portions 13a as depicted in FIG. 2E.

The terminal support frame 31 is a thin plate-like member, which may be made from any type of material, for example, a metallic plate with an insulating material coated thereon. The thickness of the terminal support frame 31 may be arbitrarily set, however a thickness of about 0.1 mm, for example, is preferred. Further, the terminal support frame 31 is preferably fixed to the bottom surfaces of the support projected portions 13 by using fixing portions 13b as depicted in FIG. 2E.

Each of the plurality of terminals 41 is supported by at least one of the terminal support film 21 and the support frame 31. A plurality of terminal openings 23 like one shown in FIG. 1C are formed in the support film 21, and, a plurality of terminal openings 32, described later, are formed in the support frame 31, and the terminals 41 are supported by at least one of the support film 21 and the support frame 31, in such a state that the terminals 41 are inserted into and passed through the openings 23 as the second openings and the terminal insertion openings 32 as the first openings. Also, as shown in FIG. 2F, the upper ends of the terminals 41 come into contact with the solder balls 62 arranged on the surface on the terminal side (the bottom surface of FIG. 2F) of the semiconductor device 61 fitted in the socket 10. Note that, on the lower surface (the bottom of FIG. 2F) of the housing 11, a semiconductor inspection device (not shown) is attached, and electric pads that are terminals of the semiconductor inspection device come into contact with the lower end portions of the terminals 41. Therefore, the solder balls 62 of the semiconductor device 61 are brought into electrical contact with the terminals of the semiconductor inspection device via the terminals 41. Note that the semiconductor device 61 is fitted in the socket 10 by being inserted into the space whose four corners are defined by the device guide portions 14.

In the example illustrated in FIG. 1B, the number of the terminals 41 is 64, and they are arranged in a grid-like pattern. However, the number and arrangement pattern of the terminals 41 are determined so as to match the number and pattern of the solder balls 62 of the semiconductor device 61. In this illustrated example, since the solder balls 62 are arranged in a grid pattern with a pitch of about 0.3 mm, the terminals 41, as well as the terminal openings 23 and the terminal insertion openings 32 in which the terminals 41 are inserted are also arranged in a grid pattern with similar pitch. The diameter of the solder ball 62 is preferably about 0.2 mm.

Figure 4:
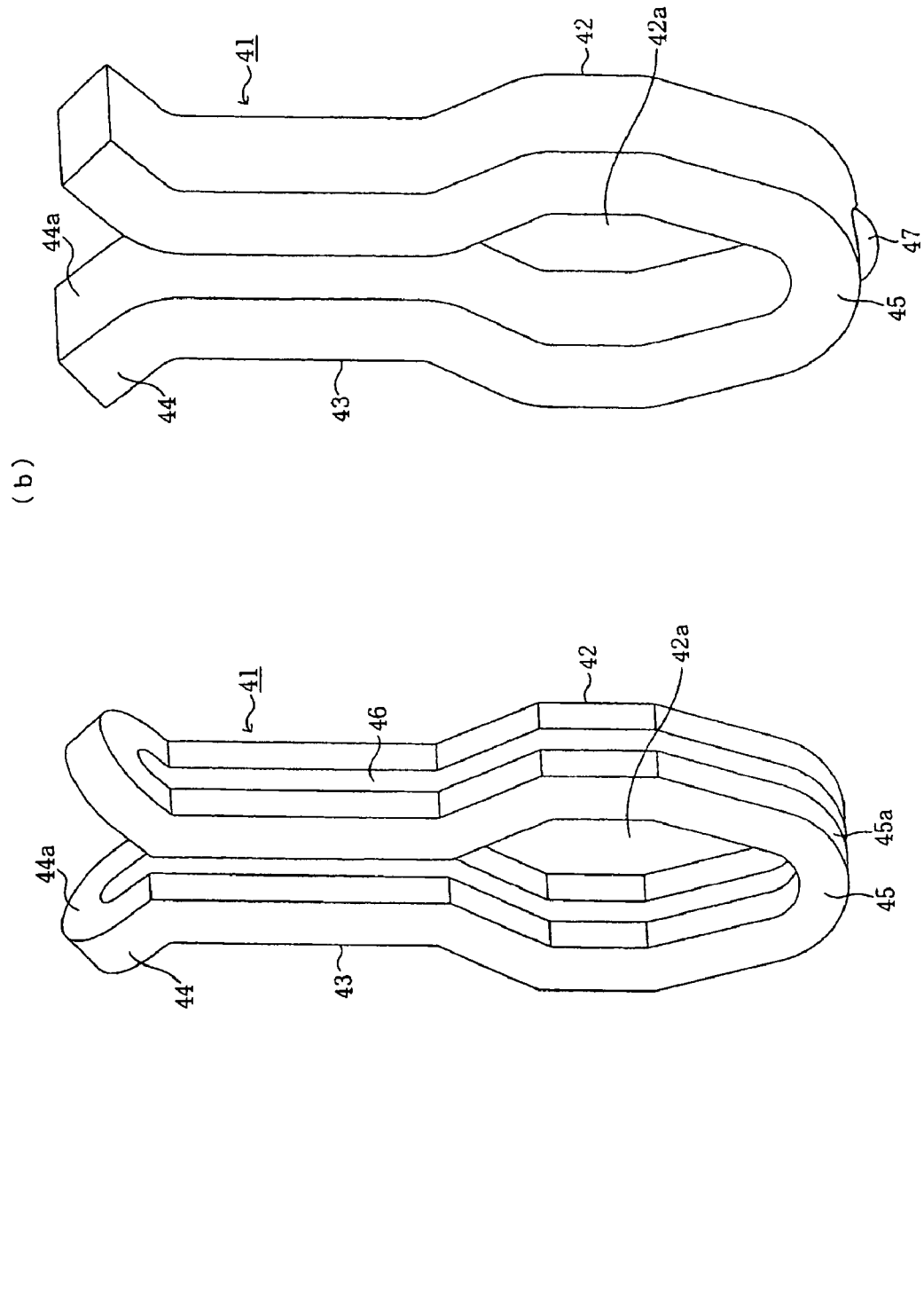
FIGS. 4A and 4B are enlarged detail views of the terminals used in the connectors of the present invention.

FIGS. 4A and 4B show the construction of the terminals and FIG. 4A shows the terminal with a slit formed therein, and FIG. 4B shows the terminal with a convex portion formed thereon.

As shown in the drawings, the terminal 41 of this embodiment is an integrally formed metal member with a shape similar to an inverted symbol for ohms and includes a body portion 42 having a general C-shape on its side with an expanded space 42a therein, and a pair of leg portions 43 extending linearly from the body portion 42 generally parallel to each other. A pair of petal-shaped portions 44 extend from free ends (top ends in FIGS. 4A and 4B) of the leg portions 43 so as to be flared toward their ends. In other words, the petal-shaped portions 44, which are inclined relative to the leg portions 43 and the distance between them increase toward their free ends, are connected to the free ends of the leg portions 43, respectively. In this embodiment, the petal-shaped portions 44 are formed so that semicircular surfaces are formed on the inner sides of the free end portions. However, the shape of the petal-shaped portions 44 is not limited to this, and the petal-shaped portions 44 may be formed so that their free end portions have a rectangular shape. Note that the inner surfaces of the petal-shaped portions 44 function as first contact portions 44a which come into contact with the solder ball 62. Further, the end portion (the lower end portion in FIGS. 4A and 4B) of the body portion 42 on the opposite side of the petal-shaped portions 44 has a bent portion 45 which is bent at nearly 180 degrees, and the outer surface of this bent portion works as a second contact portion 45a which comes into contact with the electric pad of the semiconductor inspection device.

The terminals 41 are members that are elastic in their deformation, and FIGS. 4A and 4B show the shapes of the terminals 41 in the initial state in which no external force is applied. When the first contact portions 44a contact the solder balls 62, the first contact portions 44a on the opposite sides are pressed by the solder balls 62, and the distance between the petal-shaped portions 44 as well as the distance between the leg portions 43 is increased. In other words, the petal-shaped portions 44 and the leg portions 43 are pushed apart from each other. In this case, thus the petal-shaped portions 44 and the leg portions 43 are pushed apart from each other, by mainly the bent portion 45 being elastically deformed.

Incidentally, in the example depicted in FIG. 4A, a slit 46 is formed, which continuously extends in the longitudinal direction of the terminal 41, from one of the petal-shaped portions 44 to the other petal-shaped portion 44. Therefore, the first contact portions 44a and the second contact portion 45a are separated into two in the thickness direction of the terminal 41. As a result, the first contact portions 44a on both sides have two points in contact with the solder ball 62, respectively, and the second contact portion 45a also has two points in contact with the electrode or trace of the semiconductor inspection device. This makes possible for each of the first contact portions 44a and the second contact portion 45a to have multipoint contact, so even if one of the contact points loses its contact with the counterpart terminal, the other contact points are remained in contact with their counterpart terminals. Hence, the probability of keeping the contact between the contact portions 44a and 45a, and the solder balls 62 and the trace pads of the semiconductor inspection device becomes higher, and thus the reliability of the socket 10 is improved.

Also, in the example illustrated in FIG. 4B, there is no slit 46 provided, but a projection 47 is formed on the second contact portion 45a. Therefore, when the second contact portion 45a comes into contact with the trace pad of the semiconductor inspection device, the projection 47 comes into contact with the trace pad. Therefore, a contact pressure is increased, and that further ensures the contact between the second contact portion 45a and the trace pad of the semiconductor inspection device, and the reliability of the socket 10 is improved.

In a preferred application, the terminal 41 is a member having a dimension in the thickness direction of, for example, about 0.3 mm, and a dimension in the vertical direction of, for example, about 0.7 mm. Also, the distance between the leg portions 43 in the initial state is set smaller than the diameter of the solder ball 62.

The terminal 41 in this embodiment may be any one of the examples shown in FIGS. 4A and 4B. However, herein below, the example illustrated in FIG. 4A is used for the terminals 41 for the sake of explanation.

Figure 5:
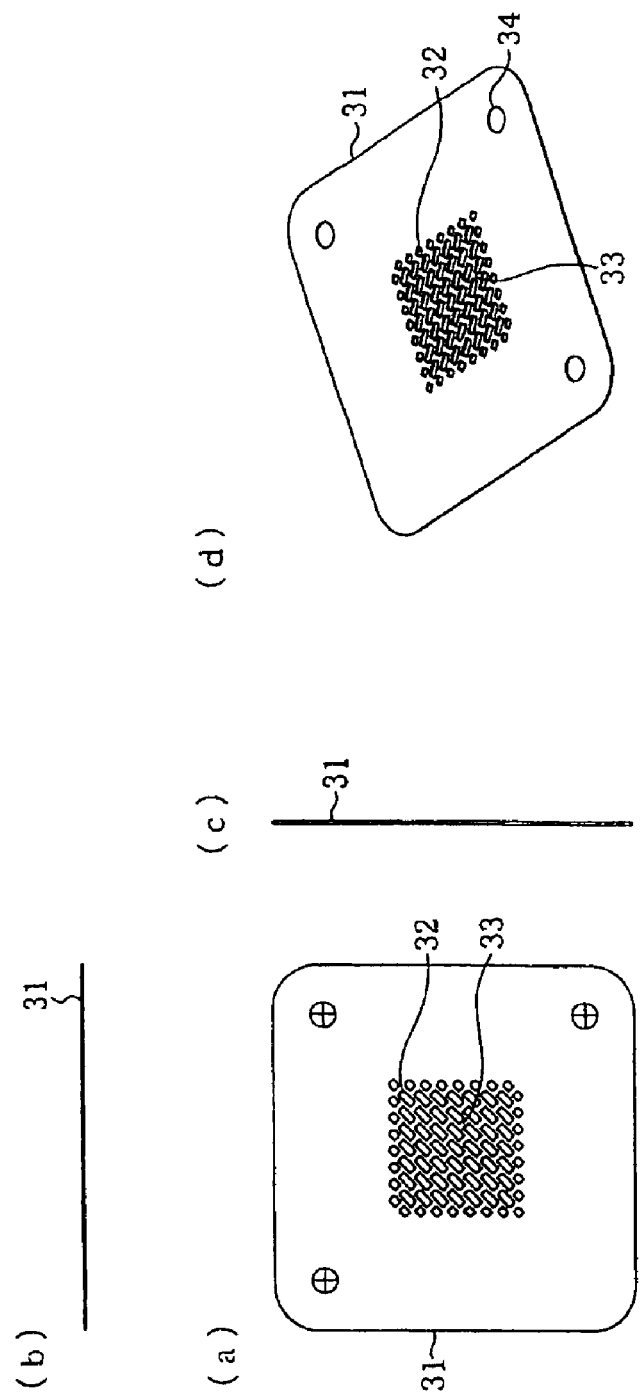
FIGS. 5A to 5D are views showing a terminal support frame according to one embodiment of the present invention.
Figure 6:
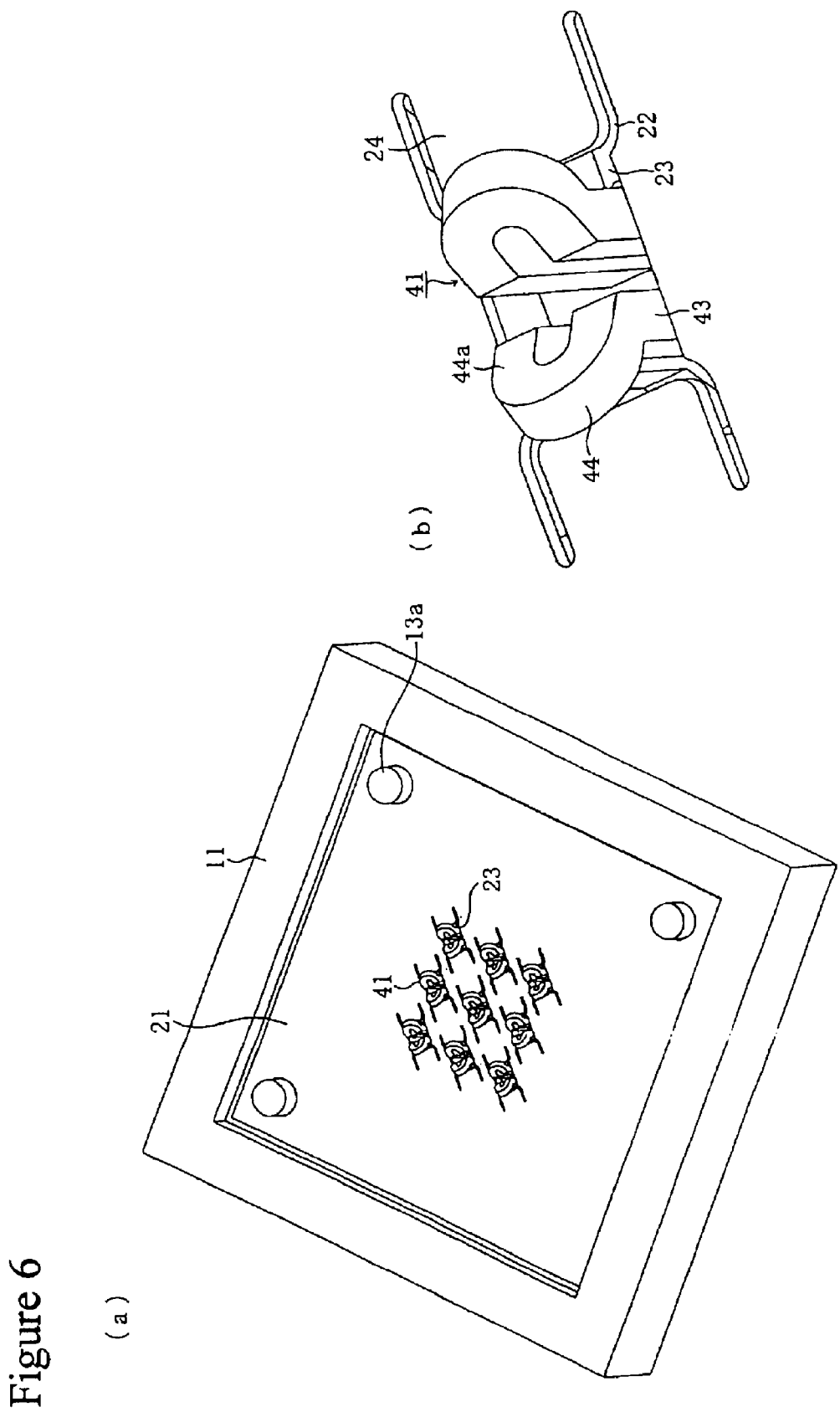
FIGS. 6A and 6B are perspective views showing a terminal support film fixed to a housing according to one embodiment of the present invention.
Figure 7:
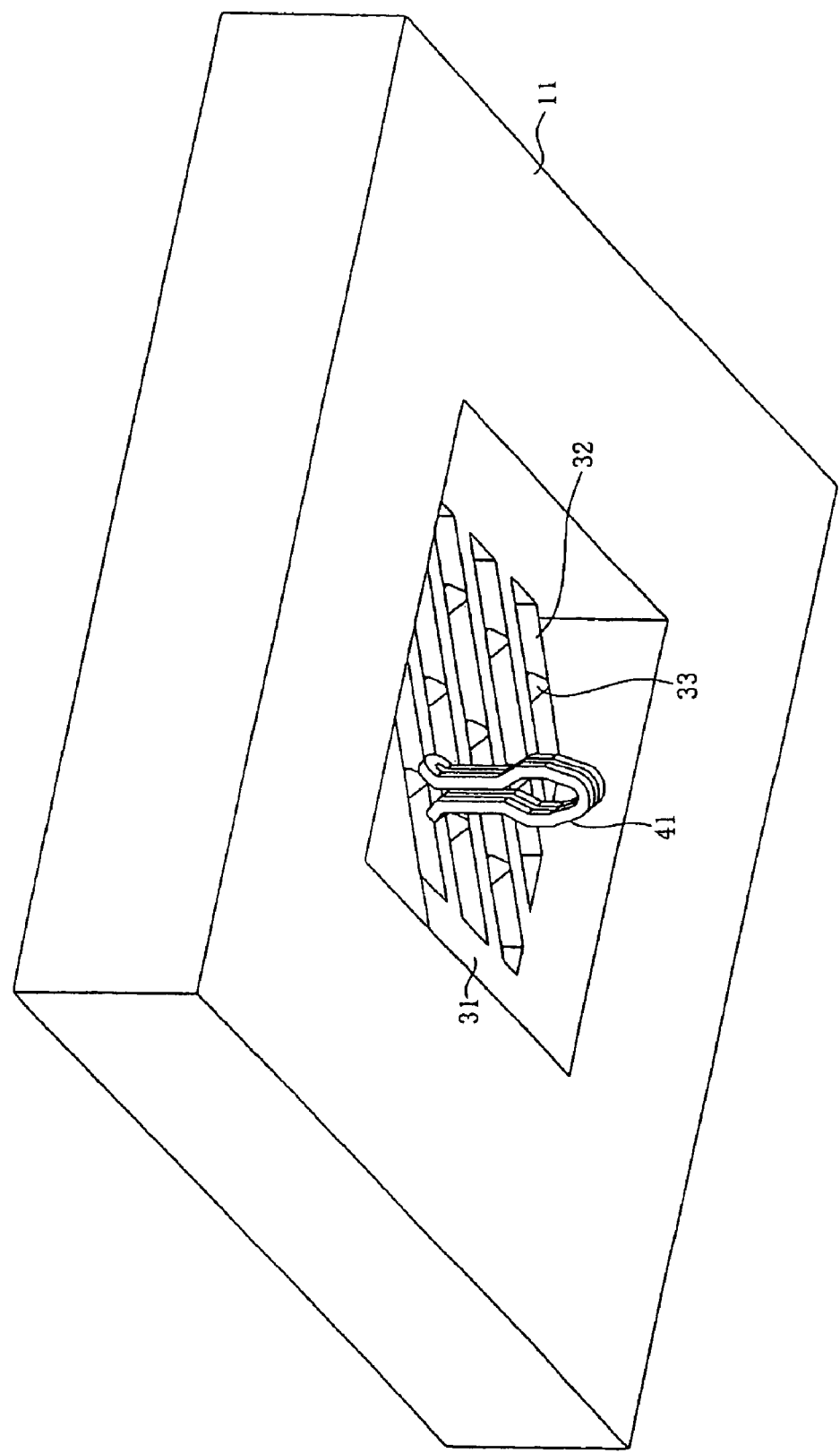
FIG. 7 is a view for illustrating the manner in which a terminal is attached according to one embodiment of the present invention.

FIGS. 5A to 5D are views showing the terminal support frame and in which FIG. 5A is a top plan view of the terminal support frame, FIG. 5B is a rear view of the terminal support frame, FIG. 5C is a side view of the terminal support frame, and FIG. 5D is a perspective view of the terminal support frame. FIG. 6A is a perspective view of the terminal support film to which the terminals are attached, and FIG. 6B is an enlarged view of FIG. 6A, showing the main part of the terminal support film to which the terminal is attached. FIG. 7 is a view illustrating the operation for attaching the terminals.

As shown in FIGS. 5A to 5D, the terminal support frame 31 is a plate member having a plurality of terminal insertion openings 32 formed in a mesh pattern as a whole. The support frame 31 is preferably a metallic plate, and can be made by, for example, pressing or electro-casting. Also, in order to prevent short-circuiting, the entire surface of the terminal support frame 31, including the openings 32, may be coated with an insulating material. The terminal support frame 31 is provided with attachment holes 34, which are engaged with the fixing portions 13b of the housing 11 so that the support frame 31 is positioned relative to the housing 11.

As clearly depicted in FIG. 7, in the illustrated example, the terminal insertion openings 32 have a rectangular shape in cross section, and beam-shaped portions 33, which separate neighboring terminal openings 32 and are inserted in the body portions 42 of the terminals 41 and work as support portions for the terminals 41. Note that FIG. 7 is a view of the terminal support frame 31 fixed to the housing 11, viewed obliquely from the bottom. In addition, FIG. 7 only shows a small number of terminal openings 32 and beam-shaped portions 33 for explanation purposes, and the rest are omitted for clarity.

An operator handles the terminal 41 to mount it on the terminal support frame 31 and the terminal support film 21, while maintaining the position of the terminal 41 so that the petal-shaped portions 44 face up, and moving the terminal 41 upward from below relative to the housing 11. When the terminal 41 is moved upward and further moved upward in such a manner that the inner portions of the petal-shaped portions 44 are brought in contact with the beam-shaped portion 33, the inclined petal-shaped portions 44 are pushed and opened by the beam-shaped portion 33. In this case, since a force applied by the finger or the like of the operator is sufficiently large, mainly the bent portion 45 is elastically deformed so that the petal-shaped portions 44 and leg portions 43 are pushed and opened. Note that it is preferred that the beam-shaped portions 33 have corners cut off and tapered in cross section. Therefore, the beam-shaped portions 33 can smoothly move into the space between the petal-shaped portions 44.

As the terminal 41 is moved upward further, the beam-shaped portion 33 relatively moves toward the body portion 42, passing beyond the petal-shaped portions 44 and the leg portions 43 on both sides of the beam-shaped portion 33, and are inserted in the expanded space 42a of the body portion 42, which is expanded in the shape of letter C. Meanwhile, both side portions of the body portion 42 are inserted in the insertion openings 32 on both sides of the beam-shaped portion 33. Once the beam-shaped portion 33 is accommodated in the space in the body portion 42, mainly the bent portion 45 elastically returns to the original state by its spring force, so the petal-shaped portions 44 and the leg portions 43 on both sides return to their original state before being pushed and opened. In this case, since the spring force is larger than the gravity generated by the weight of the terminal 41, even if the operator stops moving the terminal 41 upward, the distance between the petal-shaped portions 44 and the distance between the leg portions 43 are not increased. Therefore, the terminal 41 is supported by the beam-shaped portion 33 in a hanging manner. The expanded space 42a of the body portion 42 is sufficiently large, compared to the size of the beam-shaped portion 33, so the body portion 42 is loosely mounted on the beam-shaped portions 33, i.e., mounted in a floating manner.

Moreover, as shown in FIGS. 6A and 6B, the petal-shaped portions 44 of the terminal 41 passes through the terminal opening 23 of the support film 21, and project above the top surface of the support film 21. The support film 21 and the support frame 31 are positioned so that each support opening 23 and each beam-shaped portion 33 correspond to each other, and fixed to the housing 11. In FIG. 6A, only a small number of the terminal support openings 23 and the terminals 41 are shown for explanation.

Here, each opening 23 is formed by removing a portion of the support film 21 in an approximately rectangular shape. Also, as shown in FIG. 6B, slits 22, which extend in the directions corresponding to extensions of the opposite long sides of the openings 23, are formed in the support film 21, and tongue-shaped portions 24 are defined on both sides of the support opening 23. In each of the tongue-shaped portions 24, one end thereof is connected to the body of the support film 21, and the other end is a free end which faces one of the outer surfaces of each of the connection terminals 41, corresponding to the opening direction of the petal-shaped portion 44 and the leg portion 43.

Note that the dimension between the free ends of the tongue-shaped portions 24 on both sides is set shorter than the dimension between the outside surfaces of the terminal 41 at the top ends of the petal-shaped portions 44. Therefore, even if the operator stops moving the terminal 41 upward, the terminal 41 remained supported as the petal-shaped portions are hanged by the tongue-shaped portions 24. In this case, the tongue-shaped portions 24 that are part of the support film 21 made of, for example, a polyimide film, have some elasticity, and thus generates spring force like a cantilever plate spring. Since this spring force is larger than the gravity generated by the weight of the terminal 41, the tongue-shaped portions 24 can support the terminal 41. Hence, the petal-shaped portions 44 are loosely mounted on the tongue-shaped portions 24, in other words, mounted in a floating manner. When moving up the connection terminal 41, since a force applied by the finger or the like of the operator is sufficiently large, the petal-shaped portions 44 can pass through the terminal support opening 23 against the spring force by the tongue-shaped portions 24, and can project above the top surface of the connection terminal support film 21. Therefore, the pair of leg portions 43 and/or the pair of petal-shaped portions 44 are inserted through the terminal support opening 23.

In this way, each of the terminals 41 is mounted on the socket 10. In this case, the body portion 42 is mounted on the beam-shaped portion 33 of the terminal support frame 31 in a floating manner, and/or the petal-shaped portions 44 are mounted on the tongue-shaped portions 24 of the support film 21 in a floating manner. Thus, each of the terminals 41 is supported by the support film 21 and/or the support frame 31 in a floating manner, and is movable in the vertical direction relative to the socket 10. In other words, the body portion 42 is supported with a clearance within a range up to a point where the inner surfaces of the body portion 42 contact the beam-shaped portion 33, and the petal-shaped portions 44 are supported with a clearance within a range up to a point where the outer surfaces of the petal-shaped portions 44 or the leg portions 43 contact the tongue-shaped portions 24. If these ranges of the clearance are not equal to each other, the terminal 41 is supported while being in contact with either one of the support frame 31 and the support film 21. Therefore, even if the members including the housing 11 which constructs the socket 10, the surface of the semiconductor device 61 on the terminal side, and the surface of the semiconductor inspection device on the terminal side are distorted, independent vertical movement of each terminal 41 absorbs the distortion, and thus the solder balls 62 of the semiconductor device 61 and the trace pads of the semiconductor inspection device are brought into good electric contact with each other without fail.

Moreover, the terminals 41 can be easily mounted on the housing 11 by an operator who moves the terminals 41 upward by using his/her finger or the like. Further, to remove the terminals 41 from the housing 11, the operator simply moves the terminals down by using his/her finger or the like. Therefore, the terminals 41 can be easily removed from the housing 11. Since mounting and removal of the terminals 41 can be done easily as described above, the terminals 41 can be selectively and individually replaced, and costs for manufacturing and maintenance for the socket 10 is thus reduced.

Figure 8:
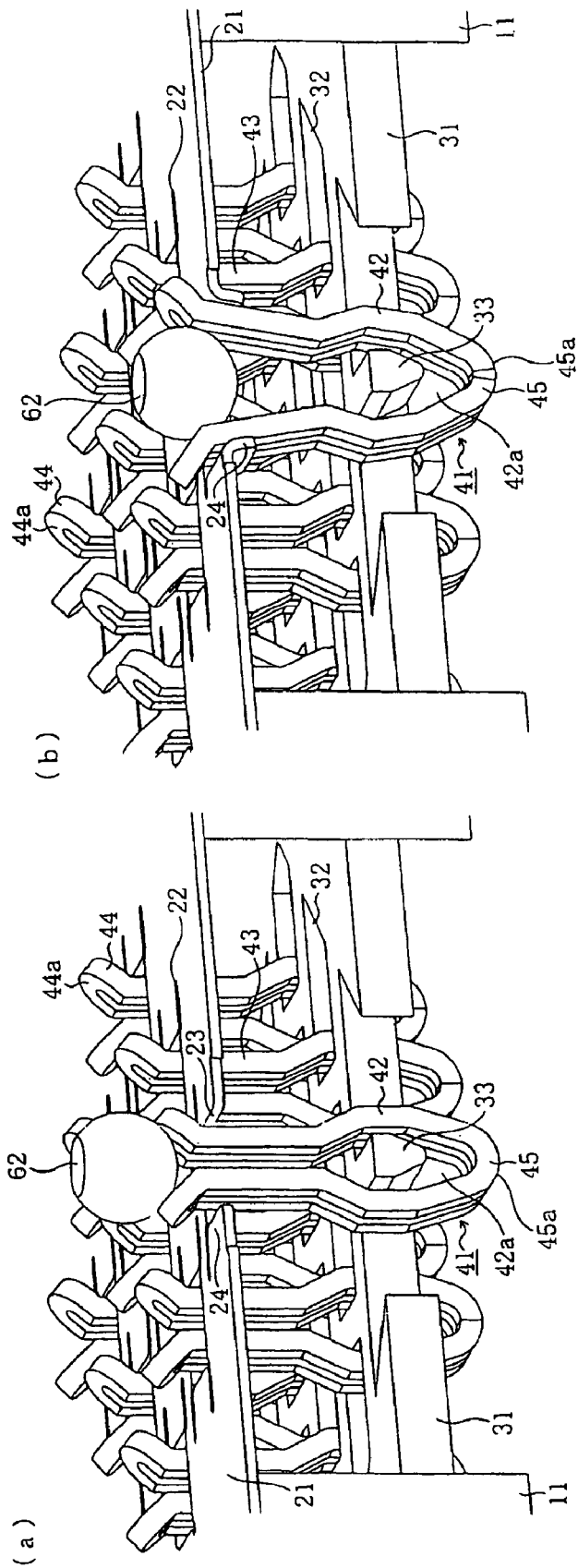
FIGS. 8A and 8B are side views illustrating the operation of the terminals of the connectors of the invention when a semiconductor device is pressed against the socket of the present invention; and, FIG. 9 is a cross-sectional view of a conventional socket.
Figure 9:
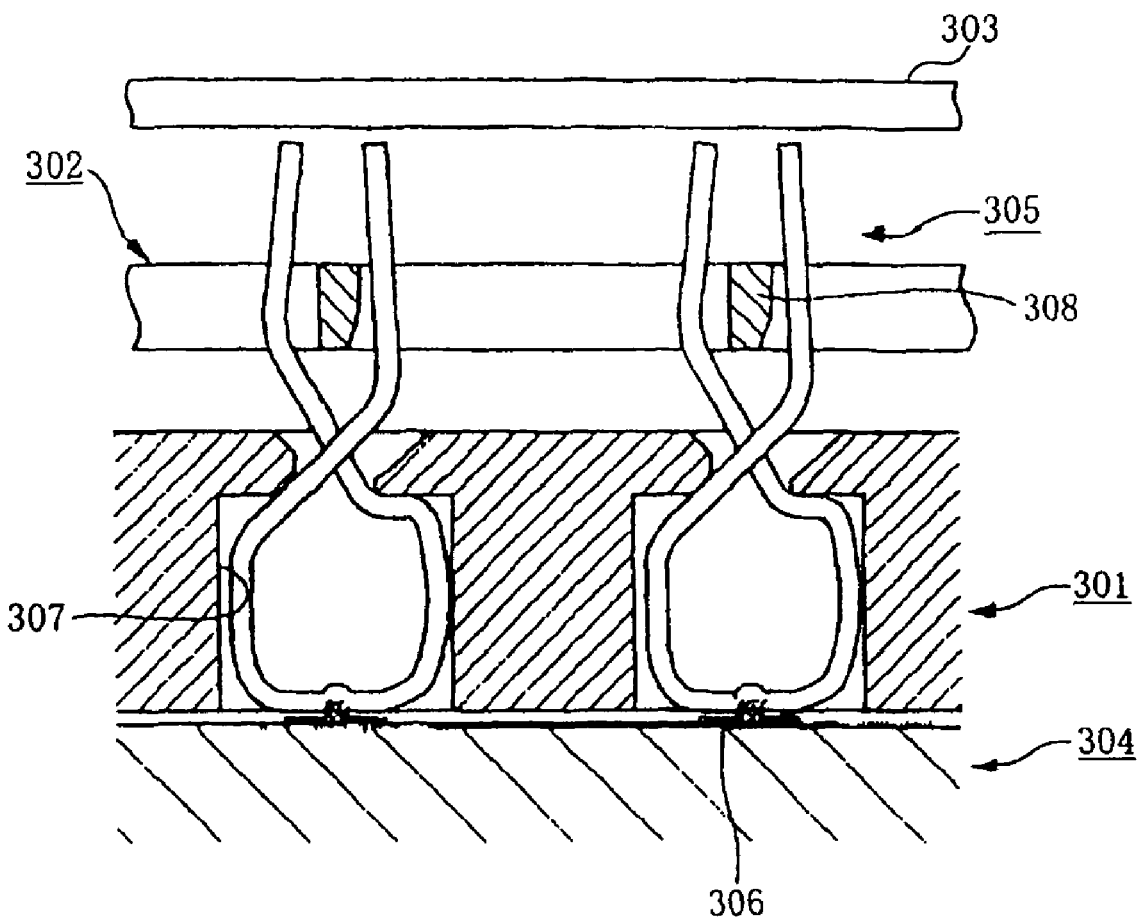

FIGS. 8A and 8B are views for illustrating the operation of the terminals when connecting the semiconductor device to the semiconductor inspection device via the socket according to the embodiment of the present invention in which FIGS. 8A and 8B sequentially show the operation.

Here, the socket 10 is already attached to the semiconductor inspection device. In FIGS. 8A and 8B, the semiconductor inspection device is not shown, but since the trace pads of the semiconductor inspection device are arranged in an arrangement corresponding to that of the solder balls 62 of the semiconductor device 61, the arrangement of the trace pads corresponds to that of the terminals 41 of the socket 10. In addition, each of the solder balls 62 of the semiconductor device 61 faces the petal-shaped portions 44 of the corresponding terminal 41, and each of the trace pads of the semiconductor inspection device faces the bent portion 45 of the corresponding terminal 41.

First, the semiconductor device 61 and the semiconductor inspection device to which the socket 10 is attached are moved relative to each other, so that the semiconductor device 61 is inserted into the space of which four sides are defined by the device guide portions 14, and thus fitted in the socket 10, as shown in FIG. 2F. Thus, the surface of the semiconductor device 61 on the terminal side and the surface of the support film 21 of the housing 11 face each other. In this case, the positioning is established in such a manner that the surface of the semiconductor device 61 on the terminal side and the surface of the support film 21 are almost parallel to each other, and positions of the solder balls 62 and those of the terminals 41 generally aligned with each other. The terminals 41 are mounted on the socket 10 in a floating manner, and the second contact portions 45a, which are the outer surfaces of the bent portions 45, are separated from the trace pads of the semiconductor inspection device.

Next, the semiconductor device 61 and the semiconductor inspection device are moved toward each other so that the solder balls 62 of the semiconductor device 61 are brought into contact with the first contact portions 44a, which are the inner surfaces of the petal-shaped portions 44 of the terminals 41, as shown in FIG. 8A. In this case, the first contact portions 44a on both sides have an inclined shape where the distance therebetween is progressively narrowed toward the bottom, and the terminals 41 are mounted on the socket 10 in a floating manner. In other words, the expanded space 42a of each of the body portions 42 is sufficiently large, compared to the size of the beam-shaped portion 33, so each of the body portions 42 is mounted on the beam-shaped portion 33 loosely, or in a floating manner. Further, since the dimension between the free ends of the tongue-shaped portions 24 is set smaller than the dimension between the outer surfaces of the petal-shaped portions 44, the petal-shaped portions 44 are mounted on the tongue-shaped portions 24 loosely, or in a floating manner.

Due to above, a self-alignment effect is brought about while the solder ball 62 enters and is fitted in between the petal-shaped portions 44 on both sides. In other words, even if the vertically extending central axis of the solder ball 62 does not match the vertically extending central axis of the corresponding connection terminal 41, as the solder ball 62 is pushed in between the petal-shaped portions 44 on both sides, the floating terminal 41 moves in the lateral direction and the vertically extending central axis of the solder ball 62 and the vertically extending central axis of the terminal 41 automatically match to each other. Therefore, even when the position of the solder ball 62 and the position of the corresponding terminal 41 do not completely match to each other in the horizontal direction, or the lateral direction, all of the solder balls 62 surely come into contact with the first contact portions 44a of the corresponding connection terminals 41 due to the self-alignment effect described above.

Next, as the semiconductor device 61 and the semiconductor inspection device are moved yet further toward each other, the solder balls 62 which are in contact with the first contact portions 44a apply downward force to the connection terminals 41. In this case, the terminals 41, which are mounted in a floating manner and can vertically move relative to the socket 10, are moved downward by the downward force applied by the solder balls 62. Therefore, the entire terminals 41 are moved downward, allowing the second contact portions 45a to come into contact with the top surfaces of the trace pads of the semiconductor inspection device (not shown). As a result, the connection terminals 41 and the corresponding trace pads of the semiconductor inspection devices are brought into conduction with each other.

Next, the semiconductor device 61 and the semiconductor inspection device are moved yet further to each other, and the solder balls 62 of the semiconductor device 61 are further moved downward against the socket 10 as shown in FIG. 8B. In this case, since the second contact portions 45a are already in contact with the top surfaces of the trace pads of the semiconductor inspection device, the entire connection terminals 41 do not move downward further. Therefore, the first contact portions 44a on both sides are pressed by the solder balls 62, and the distance between the petal-shaped portions 44 and the distance between the leg portions 43 are increased, or the petal-shaped portions 44 and the leg portions 43 are pushed and opened. In this case, as mainly the bent portion 45 is elastically deformed, the petal-shaped portions 44 and the leg portions 43 are pushed apart from each other.

Then, as the petal-shaped portions 44 and the leg portions 43 are pushed and opened, the free ends of the tongue-shape portions 24 are pressed by the outer surfaces of the petal-shaped portions 44 or the leg portions 43, resulting in deformation of the tongue-shaped portions 24 as shown in FIG. 8B. Note that, in the example shown in FIG. 8B, the tongue-shape portions 24 are deformed so that the free ends face downward, but it is also possible that the tongue-shape portions 24 may be deformed so that the free ends face upward. As described earlier, the tongue-shaped portions 24 are members which have some elasticity and thus generate a spring force like a cantilever plate spring. Therefore, the tongue-shaped portions 24 that have been deformed exert the spring force to restore in the original attitudes, and press the outer surfaces of the petal-shaped portions 44 and/or the leg portions 43 inwards. In other words, when the distance between the pair of leg portions 43 and the distance between the pair of petal-shaped portions 44 are widened, the tongue-shaped portions 24 apply a biasing force to the pair of leg portions 43 and/or the pair of petal-shaped portions 44 toward each other. Due to this biasing force, the contact pressure applied by the petal-shaped portions 44 and the leg portions 43 to the solder balls 62 increases. The terminals 41 also generate a spring force because they, mainly their bent portions 45, are deformed elastically, and therefore generate a biasing force to bring the petal-shaped portions 44 and the leg portions 43 closer to each other. However, because of the small dimensions, terminals 41 alone cannot generate a biasing force which realizes sufficient contact pressure. Nevertheless, the biasing force applied by the tongue-shaped portions 24 supplements the contact pressure from the terminals 41. Accordingly, the contact pressure applied by the petal-shaped portions 44 and/or the leg portions 43 on both sides to the solder balls 62 becomes sufficiently large.

Further, the solder balls 62 move along and slide on the inner surfaces of the petal-shaped portions 44 and/or the leg portions 43, which have been pushed and opened and inclined. Therefore, a wiping effect is exerted: matters such as impurities which inhibit electric conduction are wiped off from the surfaces of the solder balls 62 and the inner surfaces of the petal-shaped portions 44 and/or the leg portions 43. In this case, since the contact pressure applied by the petal-shaped portions 44 and/or the leg portions 43 to the solder balls 62 is large, a more definitive wiping effect is obtained. Accordingly, the solder balls 62 and the terminals 41 are brought into electrical contact without fail. Moreover, since the contact pressure applied by the petal-shaped portions 44 and the leg portions 43 to the solder balls 62 is sufficiently large, the electric conduction between the petal-shaped portions 44 and/or the leg portions 43 and the solder balls 62 is obtained more definitely, and reliability of the socket is improved.

Further, because the solder balls 62 move downward further onto the socket 10, the contact pressure applied by the second contact portions 45a to the trace pads of the semiconductor inspection device becomes sufficiently large. Therefore, the second contact portions 45a surely come into contact with the trace pads of the semiconductor inspection device, and reliability of the socket is improved.

Note that, in the example illustrated in FIGS. 8A and 8B, the dimension between the free ends of the tongue-shaped portions 24 is set larger than the dimension between the outer surfaces of the leg portions 43 in a state before the petal-shaped portions 44 and the leg portions 43 are pushed and opened, but the dimension between the free end portions can be set smaller than the dimension between the leg portions 43. In other words, in each of the tongue-shaped portions 24, the length from one end connected to the body of the connection terminal support film 21 to the free end may be extended, so that the tongue-shaped portions 24 can always apply a biasing force to the petal-shaped portions 44 and/or the leg portions 43 in a direction to push them closer to each other. Thus, a pre-load can be applied to the petal-shaped portions 44 and/or the leg portions 43 in the direction to bring them close to each other. Accordingly, the contact pressure applied by the petal-shaped portions 44 and/or the leg portions 43 to the solder balls 62 is increased.

As described above, in this embodiment, the tongue-shaped portions 24 of the support film 21 which supports the terminals 41 apply a biasing force to the petal-shaped portions 44 and/or the leg portions 43 of the terminals 41. Therefore, any distortion of the terminal side surface of the semiconductor device 61 can be absorbed, costs can be reduced by the simpler construction, and the sure contact between the connection terminals 41 and the semiconductor device 61 is obtained, thus improving reliability of the socket.

Further, the terminal support film 21 is made of a resin film, and the terminal support openings 23 are formed by removing portions of the resin film in a specific shape. Therefore, the construction of the terminal support film 21 can be simplified, and costs can be reduced.

Furthermore, one ends of the tongue-shaped portions 24 are connected to the resin film, and the free ends thereof face the outer surfaces of the pair of leg portions 43 and/or the pair of petal-shaped portions 44. Therefore, an appropriate biasing force can be applied to the pair of leg portions 43 and/or the pair of petal-shaped portions 44.

Yet further, the terminal support frame 31 is made of a metallic plate, and the insertion openings 32 are formed by removing portions of the metallic plate in a specific shape. Therefore, it is not necessary to make the support frame 31 having very small terminal insertion openings 32 by resin molding, and it becomes possible to obtain the support frame 31 with fine-sized insertion openings 32 that are beyond the limits of moldability of resin.

Moreover, the solder balls 62 of the semiconductor device 61 enter the spaces between the pair of leg portions 43 and/or the pair of petal-shaped portions 44, and increase the distance between the pair of leg portions 43 and the pair of petal-shaped portions 44. Accordingly, a wiping effect is obtained, and electrical contact between the solder balls 62 and the terminals 41 are obtained without fail.

Moreover, each of the terminals 41 has the slit 46 continuously formed from one of the petal-shaped portions 44 to the other petal-shaped portion 44. Therefore, the first contact portion 44a and the second contact portion 45a can have multipoint contact with counterpart terminals. This increases probability of leaving the terminals 41 in contact with the solder balls 62 and the electric pads of the semiconductor inspection device, and reliability of the socket is improved.

Moreover, each of the terminals 41 includes the projection 47 formed on the second contact portion 45a. Therefore, when the second contact portion 45a comes into contact with the trace pad of the semiconductor inspection device, the end of the projection 47 comes into contact with the trace pad, thus increasing the contact pressure. As a result, contact between the second contact portions 45a and the trace pads of the semiconductor inspection device is obtained more definitely, and reliability of the socket is improved.

The present invention is not limited to the above-described embodiment, and may be changed in various ways based on the gist of the present invention, and these changes are not eliminated from the scope of the present invention.

The invention claimed is:

1. A socket, comprising:
   a first support member and a second support member arranged parallel to each other, and conductive terminals supported by at least one of the first and second support members;
   each of the terminals including a body portion including a bent portion and forming an expanded space therein, a pair of leg portions extending from the body portion generally parallel to each other, and a pair of petal-shaped portions extending from free ends of the leg portions so as to be flared toward their ends;
   the first support member including has first openings that receive side portions of the terminal body portions, and beam-shaped portions separating neighboring first openings and inserted in the expanded spaces;
   the second support member including second openings that receive either said pair of leg portions and/or said pair of petal-shaped portions, and tongue-shaped portions forming opposed sides of said second openings; and,
   said tongue-shaped portions apply a biasing force directed toward each other onto said pair of leg portions and/or the pair of petal-shaped portions when a distance between said pair of leg portions and between said pair of petal-shaped portion is increased.

2. The socket according to claim 1, wherein said second support member includes a film, and said second openings are formed by removing portions of the film in an approximate H shape.

3. The socket according to claim 1, wherein said second support member includes a film, and said tongue-shaped portions are connected at one ends to the second support film and facing at free ends thereof outer surfaces of said pair of leg portions and/or said pair of petal-shaped portions.

4. The socket according to claim 1, wherein said first support member includes a metal plate, and said first openings are formed by removing portions of the plate so as to pass through the said plate.

5. The socket according to claim 1, wherein said terminals are movably supported, said pair of leg portions and/or said pair of petal-shaped portions contact said terminals of a first device to be connected to said socket, and said terminal bent portions contact terminals of a second device to be connected to said socket, so that said terminals are brought into electrical contact with each other.

6. The socket according to claim 5, wherein said terminals of said first device to be connected include solder balls, the solder balls being pushed into between said pair of leg portions and/or between said pair of petal-shaped portions to increase the distance between said pair of leg portions and/or said pair of petal-shaped portions.

7. The socket according to claim 1, wherein each of said terminals includes a slit continuously extending from one of said petal-shaped portions to the other of said petal-shaped portions.

8. The socket according to claim 1, wherein each of said terminals includes a projection formed on an outer surface of said bent portions.

* * * * *